United States Patent
Soundara Pandian et al.

(10) Patent No.: US 10,199,430 B2
(45) Date of Patent: Feb. 5, 2019

(54) MONOLITHIC INTEGRATED DEVICE

(71) Applicant: Silterra Malaysia Sdn. Bhd., Kulim (MY)

(72) Inventors: Mohanraj Soundara Pandian, Kulim (MY); Wee Song Tay, Kulim (MY); Venkatesh Madhaven, Kulim (MY); Arjun Kumar Kantimahanti, Kulim (MY)

(73) Assignee: SILTERRA MALAYSIA SDN. BHD., Kulim (MY)

( * ) Notice: Subject to any disclaimer, the term of this patent is extended or adjusted under 35 U.S.C. 154(b) by 0 days.

(21) Appl. No.: 15/494,272

(22) Filed: Apr. 21, 2017

(65) Prior Publication Data

US 2018/0151622 A1     May 31, 2018

(30) Foreign Application Priority Data

Nov. 30, 2016  (MY) .......................... PI 2016704442

(51) Int. Cl.
*H01L 27/20*    (2006.01)
*B81C 1/00*     (2006.01)
*H03H 9/25*     (2006.01)
*H03H 9/17*     (2006.01)
*H03H 9/05*     (2006.01)

(52) U.S. Cl.
CPC .......... *H01L 27/20* (2013.01); *B81C 1/00246* (2013.01); *H03H 9/25* (2013.01); *B81B 2201/0271* (2013.01); *B81B 2207/015* (2013.01); *H03H 9/0538* (2013.01); *H03H 9/173* (2013.01)

(58) Field of Classification Search
CPC ...................................................... H01L 27/20
See application file for complete search history.

(56) References Cited

U.S. PATENT DOCUMENTS

| | | |
|---|---|---|
| 5,260,596 A | 11/1993 | Dunn et al. |
| 2006/0202779 A1* | 9/2006 | Fazzio ............... B81C 1/00246 333/187 |
| 2013/0127300 A1* | 5/2013 | Umeda .................. H01L 41/18 310/365 |
| 2014/0061933 A1* | 3/2014 | Daubenspeck ....... H01L 23/481 257/773 |

(Continued)

*Primary Examiner* — Sitaramarao S Yechuri
(74) *Attorney, Agent, or Firm* — Preston Smirman; Smirman IP Law, PLLC

(57) ABSTRACT

Monolithic integrated device having an architecture that allows an acoustic device to transduce either surface acoustic waves or bulk acoustic waves, comprising: a substrate layer being the base of the device; an inter-layer dielectric disposed on top of the substrate layer; an electronic circuitry substantially formed in the inter-layer dielectric and supported by the substrate layer, the electronic circuitry comprises a plurality of metal layers; and a piezoelectric layer being sandwiched between a top electrode and a bottom electrode within the inter-layer dielectric. The top electrode is an upper metal layer belonging to the electronic circuitry and the bottom electrode is a lower metal layer belonging to the electronic circuitry. To transduce the bulk acoustic waves, the inter-layer dielectric is formed with a top cavity above the top electrode and a bottom cavity below the bottom electrode.

13 Claims, 1 Drawing Sheet

(56) References Cited

U.S. PATENT DOCUMENTS

| | | | |
|---|---|---|---|
| 2015/0130326 A1* | 5/2015 | Ishigami | H05K 3/4046 |
| | | | 310/348 |
| 2016/0294354 A1* | 10/2016 | Saijo | H03H 9/1071 |
| 2017/0179919 A1* | 6/2017 | Yang | H03H 9/0504 |
| 2017/0244379 A1* | 8/2017 | Yang | H03H 9/17 |
| 2017/0264263 A1* | 9/2017 | Huang | H03H 9/171 |

* cited by examiner

MONOLITHIC INTEGRATED DEVICE

CROSS-REFERENCE TO RELATED APPLICATION

The instant application claims priority to Malaysia Patent Application Serial No. PI 2016704442 filed Nov. 30, 2016, the entire specification of which is expressly incorporated herein by reference.

FIELD OF THE INVENTION

This disclosure relates generally to a device in the semiconductor field, and more particularly to a monolithic integrated device that is applicable in controlled-frequency circuit design applications.

BACKGROUND OF THE INVENTION

Acoustic wave device facilitates frequency filtration to enable the transmission and receiving of signals at a specific frequency bandwidth. Such device is conventionally employed in broadcast radio, television and mobile communication applications. The multitude functionality of these passive acoustic wave devices are achieved by integrating them with active circuits to form various devices like oscillators, active filters, low noise amplifiers, mass sensors, temperature sensors, etc. These electronic circuits that are fabricated by complementary-metal-oxide semiconductor, CMOS technology, and the acoustic devices that are fabricated by micro-electro mechanical systems (MEMS) technology, may be mounted on a laminated board or silicon interposer.

Generally, integration of the electronic circuits and the acoustic devices are accomplished through monolithic or heterogeneous integration methodologies where the acoustic device is built on top of the electronic circuits. As compared to heterogeneous integration, monolithic integration offers a more elegant solution. An example of a monolithic integrated device described in U.S. Patent Application Publication No. US2006/0202779 comprises a substrate, an electronic circuitry supported by the substrate, an acoustic isolator over the electronic circuitry and an acoustic resonator on the acoustic isolator that transduces bulk acoustic waves. The acoustic resonator is vertically integrated with the electronic circuitry in a single monolithic device. Such a feature of this device shortens the signal traveling distance between the acoustic resonator and the electronic circuitry as well as reduces the number of connections, thus resulting in the improvements in performance and sensitivity of the monolithic integrated device, and reducing the size of the monolithic integrated device while increasing the number of acoustic resonator components and electronic circuitry components that can be fabricated within a given area of the substrate compared to monolithic integrated devices in which the acoustic resonators are laterally integrated with electronic circuitry.

Another example of a monolithic integrated device disclosed in U.S. Pat. No. 5,260,596 describes a monolithic circuit chip that is integrated with a bulk structure resonator. The chip contains multiple integrated circuit components fabricated as part of a semiconductor substrate that is mounted with a spring for supporting a mass. An exciting means is included in this invention for applying a varying electrostatic force to the mass for inducing a mechanical vibration in the mass. A cavity fabricated on the semiconducting substrate providing room for the mechanical vibration to occur. Other embodiments of this invention incorporate the use of non-piezoelectric mechanical resonators, quartz crystal resonators and thin film piezoelectric resonators that can generate either surface acoustic waves or bulk acoustic waves.

Conventional monolithic integrated devices, in particular those that are configured to have the acoustic device being built on top of the electronic circuitry of the CMOS device, pose complexity and compatibility issues between the acoustic device and the CMOS device, which causes a trade off in the functionality of the acoustic device. Hence, the present invention disclosed herein aims to provide solutions to these problems.

SUMMARY OF THE INVENTION

An aspect of this invention is to provide a monolithic integrated device with an architecture that reduces interconnect electronic parasitics by utilizing the metal layers of the electronic circuitry as electrodes of the acoustic device through embedding the acoustic device within the electronic circuitry of the CMOS device.

Another aspect of this invention is to provide a monolithic integrated device having an architecture that enables the transduction of either the bulk acoustic waves or surface acoustic waves.

Still another aspect of this invention is to provide a monolithic integrated device having an architecture that allows the acoustic device to be integrated with the electronic circuitry with or without the passivation layer.

Yet another aspect of this invention is to provide a monolithic integrated device that enables the acoustic device to be electronically disconnected with the active electronic circuitry such that the acoustic device can be used a passive device.

Also another aspect of this invention is to provide a monolithic integrated device having a simplified architecture and arrangement of components while enhancing compatibility between the acoustic device and the CMOS device without trading off the functionality of the acoustic device.

At least one of the preceding aspects is met, in whole or in part, by this invention, in which the preferred embodiment of this invention describes a monolithic integrated device which comprises: a substrate layer being the base of the device; an inter-layer dielectric disposed on top of the substrate layer; an electronic circuitry substantially formed in the inter-layer dielectric and supported by the substrate layer, the electronic circuitry comprises a plurality of metal layers; and a piezoelectric layer being sandwiched between a top electrode and a bottom electrode within the inter-layer dielectric; wherein the top electrode is an upper metal layer belonging to the electronic circuitry and the bottom electrode is a lower metal layer belonging to the electronic circuitry. Such architecture allows the transduction of surface acoustic waves. In order to transduce bulk acoustic waves, cavities on top of the top electrode and below the bottom electrode may be created.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

Other advantages of the present invention will be readily appreciated as the same becomes better understood by reference to the following detailed description when considered in connection with the accompanying drawings wherein.

The same reference numerals refer to the same parts throughout the various Figures.

DETAILED DESCRIPTION OF THE INVENTION

For a better understanding of the invention, preferred embodiments of the invention that are illustrated in the accompanying drawings will be described in detail.

The invention disclosed herein pertains to a monolithic integrated device that integrates an acoustic device with an electronic circuitry that may be fabricated by complementary-metal-oxide semiconductor, CMOS technology. Depending on the type of electronic circuitry and acoustic device, the monolithic integrated device can be formed as oscillators, active filters, low noise amplifiers, mass sensors, temperature sensors etc. with the integration of the acoustic device that generates an electric charge in response to applied mechanical stress. The acoustic wave device which is a passive electronic frequency generator is generally formed by a piezoelectric layer (301) that is sandwiched between a top electrode and a bottom electrode. It should be noted that the term "electronic circuitry" used herein refers to an active circuitry that comprises an electronic component or a plurality of electronic components that may be connected by electrical connections such as a CMOS device.

Figure 1:
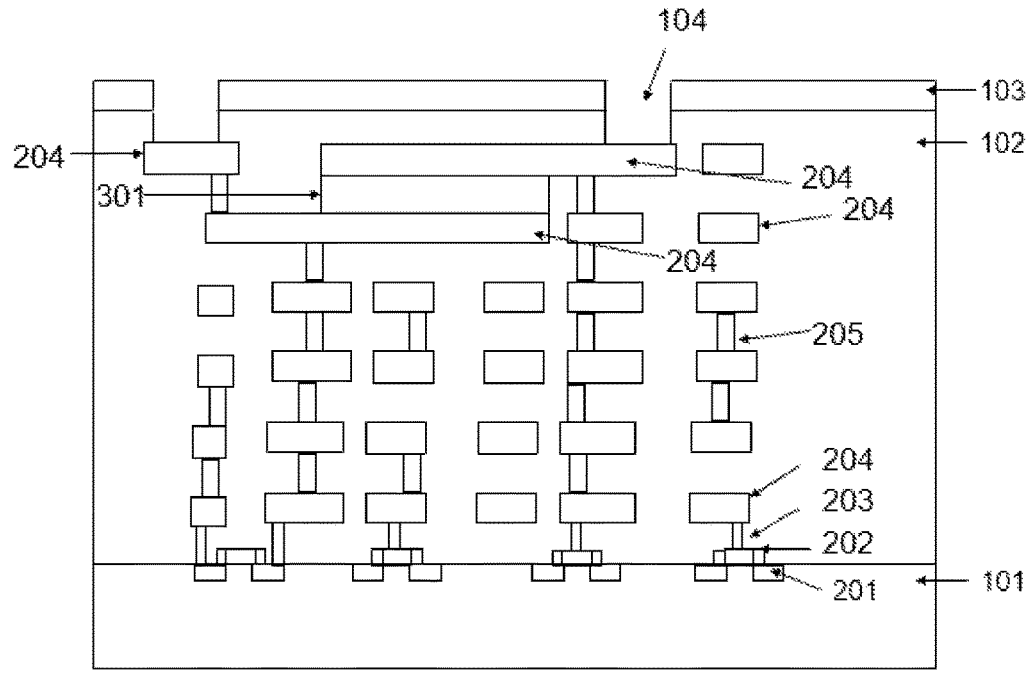
FIG. 1 shows a schematic diagram of a monolithic integrated device having an architecture that allows the transduction of surface acoustic waves by the acoustic device.
Figure 2:
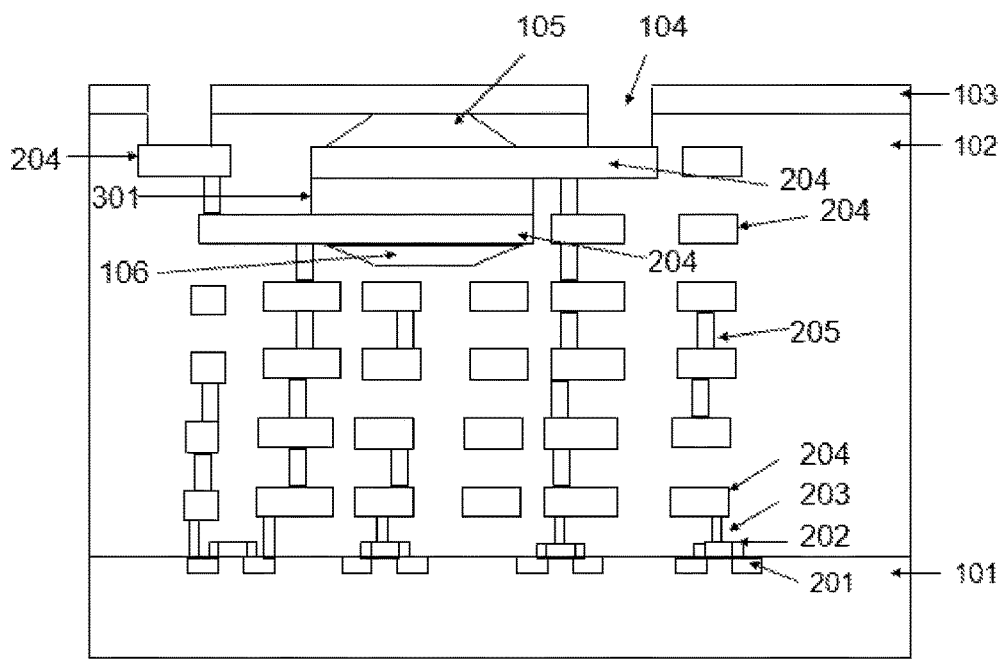
FIG. 2 shows a schematic diagram of a monolithic integrated device having an architecture that allows the transduction of either the surface acoustic waves or the bulk acoustic waves by the acoustic device.

With reference to FIGS. 1 and 2, the monolithic integrated device has a substrate layer (101) that acts as the base of the device. The substrate (101) may be made of a semiconductor such as but not limited to silicon. An inter-layer dielectric (102) may be disposed on top of the substrate layer (101) where an electronic circuitry may be substantially formed therewithin and supported by the substrate layer (101).

The electronic circuitry comprises at least a gate (202) in the inter-layer dielectric (102), at least a source and drain region (201) that has a source and a drain respectively connected to the gate (202), a plurality of metal layers (204), at least a contact component (203) for connecting any one or combination of the source and drain region (201) and the gate (202) to one of the metals layers (204), and vias (205) for connecting different metal layers.

The gate (202), source and drain may be terminals of a field-effect transistor (FET) that uses electric field to control current flow of the electronic circuitry. A voltage may be applied to the gate (202) that may be insulated from the rest of the components of the electronic circuitry. The applied gate voltage imposes an electric field into the electronic circuitry, resulting in the attraction or repulsion of the charge carriers to or from the region between the source and the drain. The density of the charge influences the conductivity between the source and the drain, thereby controlling the current flow of the electronic circuitry. As shown in FIGS. 1 and 2, the contact components (203) may be utilized to connect the gate (202) to any one of the metals layers (204), as well as the source and drain region (201) to any one of the metals layers (204). Different metal layers may be connected by vias (205).

The monolithic integrated device described herein features the sharing of metal layers (204) between the electronic circuitry and the acoustic device. This may be made possible by utilizing two different metal layers (204) as the top electrode and the bottom electrode of the acoustic device. A piezoelectric layer (301) may be sandwiched between the top electrode and the bottom electrode within the inter-layer dielectric (102). Thus, unlike conventional monolithic integrated devices, the acoustic device may not be formed on top of the electronic circuitry, instead it may be embedded within the inter-layer dielectric (102). The top electrode may be an upper metal layer and the bottom electrode is a lower metal layer. Besides that, such architecture and configuration of elements of this monolithic integrated device allow the acoustic device to be used as a passive device when the acoustic device may be electronically disconnected from the active electronic circuitry despite the acoustic device using the metal layers (204) of the electronic circuitry as the electrodes.

A passivation layer (103) that may serve as a protection layer for the electronic circuitry and the piezoelectric layer (301) may be optionally formed over the inter-layer dielectric (102). Conventionally, the acoustic device may be built on top of the passivation layer (103). By embedding the acoustic device within the inter-layer dielectric (102) through using the metals layers (204) of the electronic circuitry as the electrodes of the acoustic device, integration of the acoustic device with the electronic circuitry can be achieved even without the passivation layer (103). The device may be created with at least a bond-pad opening (104) that extends through the passivation layer (103) and partially into the inter-layer dielectric (102) until the bond-pad opening (104) reaches one of the metals layers (204) that may be used as a bonding pad of the monolithic integrated device. Preferably, these bond-pad openings may be etched into the passivation layer (103) and the inter-layer dielectric (102) to expose the bonding pad.

One of the main features of the invention is its architecture that enables the transduction of either a surface acoustic wave or a bulk acoustic wave. FIG. 1 illustrates the architecture of the monolithic integrated device that allows the acoustic device to transduce the surface acoustic wave, whereas FIG. 2 depicts the architecture of the monolithic integrated device that can be used for transducing the surface acoustic wave or bulk acoustic wave. In FIG. 1, no cavity for vibration of the piezoelectric layer (301) may be formed above and below the electrodes. Therefore, the acoustic device in the monolithic integrated device shown in FIG. 1 transduces surface acoustic waves. On the other hand, the inter-layer dielectric (102) in FIG. 2 may be formed with a top cavity (105) above the top electrode and a bottom cavity (106) below the bottom electrode. These cavities (105, 106) provide room for vibration of the piezoelectric layer (301), thus allowing the piezoelectric layer (301) to transduce bulk acoustic waves or surface acoustic waves.

While the invention has been described with reference to an exemplary embodiment, it will be understood by those skilled in the art that various changes can be made and equivalents can be substituted for elements thereof without departing from the scope of the invention. In addition, many modifications can be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A monolithic integrated device, comprising:
   a substrate layer being the base of the device;
   an inter-layer dielectric disposed on top of the substrate layer;
   an electronic circuitry substantially formed in the inter-layer dielectric and supported by the substrate layer, the electronic circuitry including a plurality of metal layers;
   a passivation layer formed on top of the inter-layer dielectric; and
   a piezoelectric layer being sandwiched between a top electrode and a bottom electrode within the inter-layer dielectric;
   wherein the top electrode is positioned in proximity to the passivation layer;
   wherein the monolithic integrated device is formed with a first bond-pad opening that extends through the passivation layer and partially into the inter-layer dielectric until the first bond-pad opening reaches one of the metal layers from the electronic circuitry that serves as a top electrode and a first bonding pad;
   wherein the monolithic integrated device is formed with a second bond-pad opening that extends through the passivation layer and partially into the inter-layer dielectric until the second bond-pad opening reaches one of the metal layers from the electronic circuitry that serves as a bottom electrode and a second bonding pad.

2. The monolithic integrated device according to claim 1, wherein the inter-layer dielectric is formed with a top cavity above the top electrode and a bottom cavity below the bottom electrode.

3. The monolithic integrated device according to claim 1, wherein the electronic circuitry includes at least a gate in the inter-layer dielectric.

4. The monolithic integrated device according to claim 3, wherein the electronic circuitry includes at least a source and drain region that has a source and a drain respectively connected to the gate.

5. The monolithic integrated device according to claim 4, wherein the electronic circuitry includes at least a contact component for connecting any one or combination of the source and drain region and the gate to one of the metals layers.

6. The monolithic integrated device according to claim 1, further comprising one or more vias for connecting different metal layers.

7. The monolithic integrated device according to claim 1, wherein the electronic circuitry is a CMOS device.

8. A monolithic integrated device, comprising:
   a substrate layer being the base of the device;
   an inter-layer dielectric disposed on top of the substrate layer;
   a passivation layer disposed on top of the inter-layer dielectric;
   an electronic circuitry substantially formed in the inter-layer dielectric and supported by the substrate layer, the electronic circuitry including a plurality of metal layers; and
   a piezoelectric layer being sandwiched between a top electrode and a bottom electrode within the inter-layer dielectric, the top electrode is an upper metal layer belonging to the electronic circuitry and the bottom electrode is a lower metal layer belonging to the electronic circuitry;
   wherein the top electrode is positioned in proximity to the passivation layer;
   wherein the monolithic integrated device is formed with a first bond-pad opening that extends through the passivation layer and partially into the inter-layer dielectric until the first bond-pad opening reaches one of the metal layers from the electronic circuitry that serves as a top electrode and a first bonding pad;
   wherein the monolithic integrated device is formed with a second bond-pad opening that extends through the passivation layer and partially into the inter-layer dielectric until the second bond-pad opening reaches one of the metal layers from the electronic circuitry that serves as a bottom electrode and a second bonding pad.

9. The monolithic integrated device according to claim 8, wherein the electronic circuitry includes at least a gate in the inter-layer dielectric.

10. The monolithic integrated device according to claim 9, wherein the electronic circuitry includes at least a source and drain region that has a source and a drain respectively connected to the gate.

11. The monolithic integrated device according to claim 10, wherein the electronic circuitry includes at least a contact component for connecting any one or combination of the source and drain region and the gate to one of the metals layers.

12. The monolithic integrated device according to claim 8, further comprising one or more vias for connecting different metal layers.

13. The monolithic integrated device according to claim 8, wherein the electronic circuitry is a CMOS device.

* * * * *